United States Patent
Huang

(10) Patent No.: US 10,038,159 B2
(45) Date of Patent: Jul. 31, 2018

(54) ORGANIC ELECTROLUMINESCENT DEVICE STRUCTURE AND MANUFACTURING FOR THE SAME

(71) Applicant: Shenzhen China Star Optoelectronics Technology Co., Ltd., Shenzhen (CN)

(72) Inventor: Hui Huang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 237 days.

(21) Appl. No.: 14/785,856

(22) PCT Filed: Aug. 24, 2015

(86) PCT No.: PCT/CN2015/087911
§ 371 (c)(1),
(2) Date: Oct. 21, 2015

(87) PCT Pub. No.: WO2017/020361
PCT Pub. Date: Feb. 9, 2017

(65) Prior Publication Data
US 2017/0162819 A1    Jun. 8, 2017

(30) Foreign Application Priority Data
Aug. 3, 2015 (CN) .......................... 2015 1 0478924

(51) Int. Cl.
*H01L 51/52*   (2006.01)
*G09G 3/3208*  (2016.01)
*H01L 51/00*   (2006.01)

(52) U.S. Cl.
CPC ....... *H01L 51/5209* (2013.01); *G09G 3/3208* (2013.01); *H01L 51/0003* (2013.01); *H01L 51/0014* (2013.01); *H01L 51/0026* (2013.01); *H01L 51/5206* (2013.01)

(58) Field of Classification Search
None
See application file for complete search history.

(56) References Cited

U.S. PATENT DOCUMENTS

2014/0027753 A1*  1/2014  Yamana ............. H01L 51/5209
                                                    257/40
2015/0200382 A1*  7/2015  Moon ................ H01L 51/5271
                                                    257/40

* cited by examiner

*Primary Examiner* — Alexander Ghyka
(74) *Attorney, Agent, or Firm* — Leong C. Lei

(57) ABSTRACT

An organic electroluminescent device structure and manufacturing method for the same are provided. Surfaces of an anode, an organic electroluminescent structure and a cathode all have arc structures undulating periodically to avoid the total reflection in propagating an exit light to the substrate, increasing the light efficiency. Utilizing a PEDOT:PSS thin film as a material for the anode to replace an ITO material, the cost is reduced. The manufacturing method utilizes a wet coating process to form the PEDOT:PSS thin film as the anode so as to reduce the cost. Utilizing a transfer-printing method to pattern the PEDOT:PSS thin film to form an arc structure undulating periodically on the PEDOT:PSS thin film (the anode) to avoid the total reflection inside the organic electroluminescent device such that most light can be propagated out from the substrate. Accordingly, a light efficiency of the bottom-emitting type organic electroluminescent device is increased.

5 Claims, 5 Drawing Sheets

ORGANIC ELECTROLUMINESCENT DEVICE STRUCTURE AND MANUFACTURING FOR THE SAME

BACKGROUND OF THE INVENTION

1. Field of the Invention

The present invention relates to an electric light source technology field, and more particularly to an organic electroluminescent device structure and manufacturing for the same.

2. Description of Related Art

Currently, in the illumination and display field, an Organic Light-Emitting Diode (OLED) is widely applied in an illumination product and a display panel because of characteristics of a low starting voltage, thin, self-illumination and so on in order to meet the requirements of low energy consumption, self-illumination, and a surface light source and so on. In the display panel industry, comparing with the conventional Thin Film Transistor-Liquid Crystal Display (TFT-LCD), an OLED device has a very excellent display performance. Specifically, features of self-illumination, simple structure, ultra-thin, fast response, wide viewing angle, low power consumption and can realize flexible display and so on. Therefore, the OLED device has been called as a "dream display". Besides, the cost of the production equipment is less than the LCD display device so that the OLED device has become a mainstream of the third-generation display in the display technology field. Currently, the OLED device is ready for a mass production. With further research and new technologies continuing to emerge, the OLED device will have a breakthrough development.

As shown in FIG. 1, an OLED device sequentially has an anode 200, an organic light emitting layer 300 and a cathode 400 sequentially disposed on a substrate 100. For a bottom-emitting type OLED device, paths for a light to exit usually are: the organic light emitting layer 300, the anode 200, the substrate 100 and an air. A light emitted by the organic light emitting layer 300 passes through above four paths to reach the air, and enters eyes of a human. The organic light emitting layer 300 is made of a small organic molecule material, and the refractive index is about 1.6-1.7. The anode 200 is made of an indium-tin-oxide (ITO) thin film, and the refractive index is about 1.8. The substrate 100 is a glass substrate, and the refractive index is 1.5. The refractive index of the air is 1.0. Accordingly, when a light enters the air from the organic light emitting layer 300, with reference to FIG. 2, the light is propagated from an optically denser medium (with a higher refractive index) to an optically thinner medium (with a lower refractive index). For example, light is propagated from the ITO anode 200 having the refractive index 1.8 to the glass substrate having the refractive index 1.5. Therefore, a total reflection phenomenon is existed. A light having an incident angle greater than a critical angle cannot reach the glass substrate because of the total reflection phenomenon. The light which cannot reach the glass substrate will be absorbed internally and lost. Currently, a conventional OLED device only has a light emitting efficiency about 17%, and most of the light is lost because of the total reflection at the interfaces.

A high flexible PEDOT:PSS (Poly (3,4-ethylenedioxythiophene)-poly (styrenesulfonate)) thin film using as an organic transparent conductive film coating has been paid attention in the material field. Because the property of the PEDOT:PSS solution, a common wet coating method can be used for manufacturing the PEDOT:PSS thin film. Comparing with an Indium-Tin-Oxide (ITO) film, required equipment is greatly reduced. Besides, the PEDOT:PSS thin film has been applied at the antistatic coating layer so that relative technology is mature.

SUMMARY OF THE INVENTION

The purpose of the present invention is to provide an organic electroluminescent device structure capable of avoiding a total reflection in propagating an exit light to the substrate so as to increase the light efficiency. Besides, the present invention utilizes a PEDOT:PSS thin film as a material for an anode so that the cost is reduced.

The present invention also provides a manufacturing method for an organic electroluminescent device. Utilizing a wet coating process to form the PEDOT:PSS thin film as the anode so as to reduce the cost. Utilizing a transfer-printing method to pattern the PEDOT:PSS thin film so as to form an arc structure undulating periodically on the PEDOT:PSS thin film. In the present invention, an incident angle of an emitting light emitted by the organic electroluminescent structure is changed so that a light efficiency of the bottom-emitting type organic electroluminescent device is increased.

In order to achieve the above purpose, the present invention provides an organic electroluminescent device structure, comprising: a substrate; an anode disposed on the substrate; an organic electroluminescent structure disposed on the anode; a cathode disposed on the organic electroluminescent structure; wherein, a material of the anode is a PEDOT:PSS thin film, and a surface of each of the anode, the organic electroluminescent structure and the cathode has an arc structure undulating periodically.

Wherein, the arc structure undulating periodically is a wavy arc shape.

Wherein, the arc structure undulating periodically is formed by multiple projected semicircles and multiple depressed semicircles connected alternately.

Wherein, the organic electroluminescent structure includes a hole injection layer, a hole transport layer and an organic light-emitting layer.

Wherein, the cathode is made of a metal material or an alloy material.

The present invention also provides a manufacturing method for an organic electroluminescent device, comprising: step 1: providing a substrate and a PEDOT:PSS solution, and utilizing a wet coating process to coat the PEDOT:PSS solution on the substrate in order to obtain a PEDOT:PSS thin film; step 2: providing a template mold, wherein the template mold is provided with an arc pattern undulating periodically, and utilizing a transfer printing method to duplicate the arc pattern on the template mold on the PEDOT:PSS thin film in order to form an arc structure undulating periodically on a surface of the PEDOT:PSS thin film; step 3: utilizing an ultraviolet light to cure the PEDOT:PSS thin film, and removing the template mold in order to obtain an anode of an organic electroluminescent device; and step 4: sequentially forming an organic electroluminescent structure and a cathode above the anode in order to obtain the organic electroluminescent device.

Wherein, the substrate provided in the step 1 is a glass substrate and a flexible substrate.

Wherein, the wet coating process in the step 1 is a spin coating process.

Wherein, the organic electroluminescent device structure formed in the step 4 includes a hole injection layer, a hole transport layer and an organic light-emitting layer.

Wherein, the cathode formed in the step 4 utilizes a metal material or an alloy material.

The present invention also provides a manufacturing method for an organic electroluminescent device, comprising: step 1: providing a substrate and a PEDOT:PSS solution, and utilizing a wet coating process to coat the PEDOT:PSS solution on the substrate in order to obtain a PEDOT:PSS thin film; step 2: providing a template mold, wherein the template mold is provided with an arc pattern undulating periodically, and utilizing a transfer printing method to duplicate the arc pattern on the template mold on the PEDOT:PSS thin film in order to form an arc structure undulating periodically on a surface of the PEDOT:PSS thin film; step 3: utilizing an ultraviolet light to cure the PEDOT:PSS thin film, and removing the template mold in order to obtain an anode of an organic electroluminescent device; and step 4: sequentially forming an organic electroluminescent structure and a cathode above the anode in order to obtain the organic electroluminescent device; wherein the substrate provided in the step 1 is a glass substrate and a flexible substrate; wherein the wet coating process in the step 1 is a spin coating process; wherein the organic electroluminescent device structure formed in the step 4 includes a hole injection layer, a hole transport layer and an organic light-emitting layer; and wherein the cathode formed in the step 4 utilizes a metal material or an alloy material.

The beneficial effects of the present invention: in the organic electroluminescent device structure of the present invention, surfaces of the anode, the organic electroluminescent structure and the cathode all have arc structures undulating periodically so as to avoid the total reflection in propagating an exit light to the substrate, and increase the light efficiency. Besides, the present invention utilizes a PEDOT:PSS thin film as a material for the anode to replace an ITO material so that the cost is reduced. The present invention also provides a manufacturing method for an organic electroluminescent device. Utilizing a wet coating process to form the PEDOT:PSS thin film as the anode so as to reduce the cost. Utilizing a transfer-printing method to pattern the PEDOT:PSS thin film so as to form an arc structure undulating periodically on the PEDOT:PSS thin film (that is, the anode). The manufacturing method is simple and easy to implement. In the organic electroluminescent device manufactured by the present invention, an incident angle of an emitting light emitted by the organic electroluminescent structure is decreased because of changing the interfaces of the organic electroluminescent device so as to avoid the total reflection inside the organic electroluminescent device such that most light can be propagated out from the substrate. Accordingly, a light efficiency of the bottom-emitting type organic electroluminescent device is increased.

In order to more clearly illustrate the features of the present invention and the technology content, please refer to following detailed description and figures of the present invention. However, the figures are provided for reference and for illustrating, not for limiting the present invention.

BRIEF DESCRIPTION OF THE DRAWINGS

The following will combine the figures. Through detailed description of the specific embodiments of the present invention, the technology solution and the beneficial effects of the present invention will become obvious.

In the figures.

DETAILED DESCRIPTION OF THE PREFERRED EMBODIMENT

For further illustrating the technology solution and the effects adopted by the present invention, the following content will combine preferred embodiments and figures to describe in detail.

Figure 1:
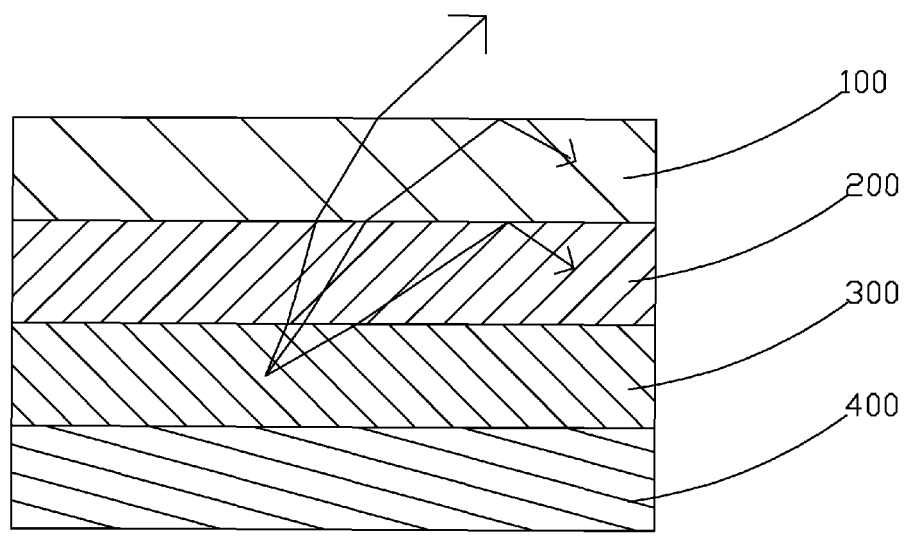
FIG. 1 is a schematic cross-sectional view of a bottom-emitting type organic electroluminescent device according to the conventional art.
Figure 2:
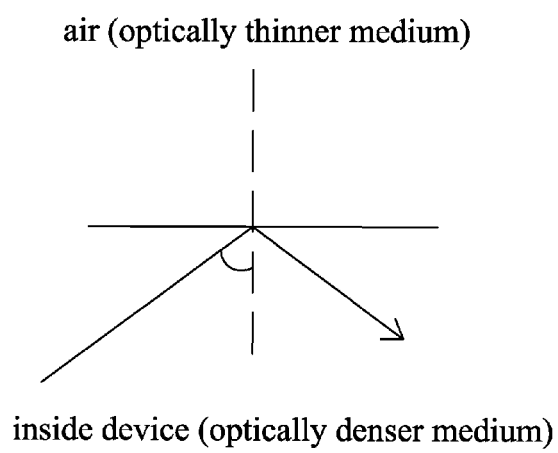
FIG. 2 is a schematic diagram of a light propagation path of the organic electroluminescent device in FIG. 1.
Figure 3:
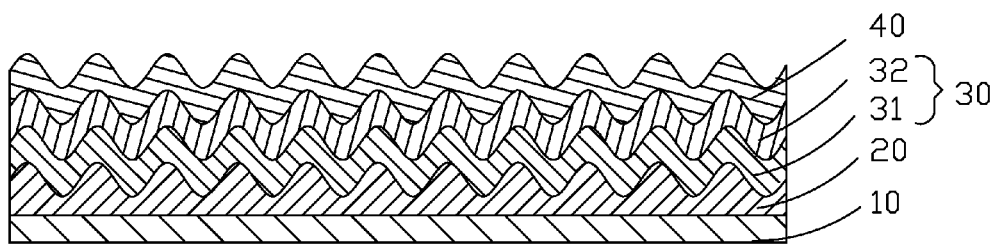
FIG. 3 is a cross-sectional view of an organic electroluminescent device according to a first embodiment of the present invention.
Figure 4:
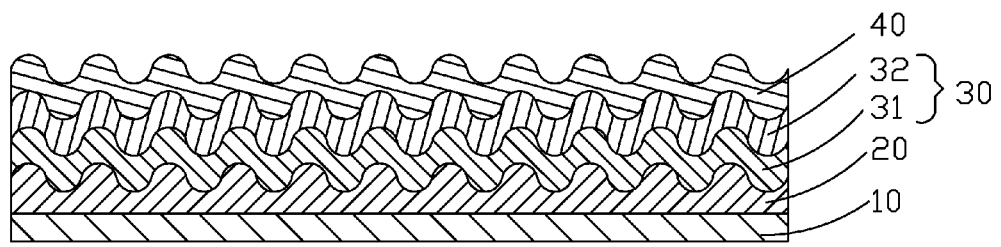
FIG. 4 is a cross-sectional view of an organic electroluminescent device according to a second embodiment of the present invention.

With reference to FIG. 3 and FIG. 4, firstly, the present invention provides an organic electroluminescent device structure, including a substrate 10, an anode 20 disposed on the substrate 10, an organic electroluminescent structure 30, and a cathode 40 disposed on the organic electroluminescent structure 30.

Specifically, the anode 20 is a PEDOT:PSS (Poly (3,4-ethylenedioxythiophene)-poly (styrenesulfonate)) thin film formed by coating a PEDOT:PSS solution. Comparing with using an Indium-Tin-Oxide (ITO) material as the anode, the raw material cost and the production cost are significantly reduced. Wherein, the PEDOT mainly has functions of transporting holes and increasing an electrical conductivity. The PSS does not have an electrical conductivity itself, and the PSS mainly used for increasing an adhesiveness and solubility.

Specifically, a structural formula of PEDOT is:

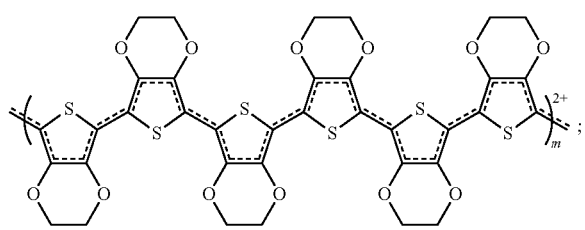

Specifically, a structural formula of the PSS is:

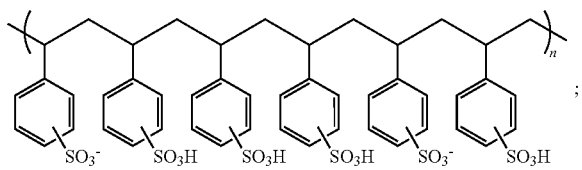

Wherein, n>1, m>5, n and m are both integers.

Figure 5:
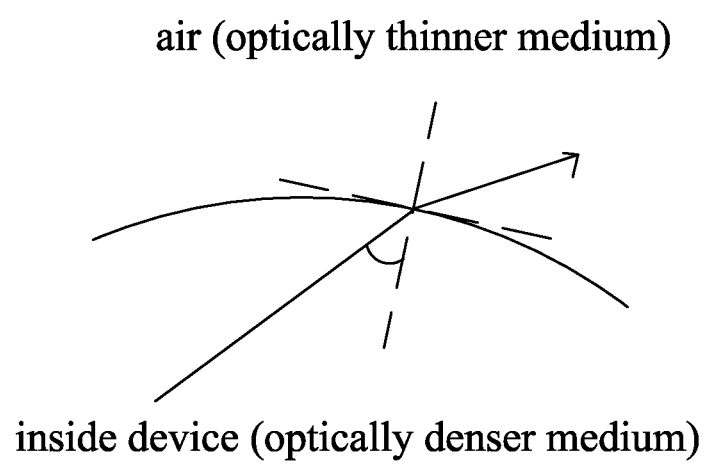
FIG. 5 is a schematic diagram of a light propagation path of the organic electroluminescent device according to the present invention.

Specifically, a surface of each of the anode 20, the organic electroluminescent structure 30, and the cathode 40 has an arc structure undulating periodically. Specifically, a surface of the anode 20 which is contacted with the organic electroluminescent structure 30 has the arc structure undulating periodically. Upper and lower surfaces of the organic electroluminescent structure 30 disposed on the anode 20 also have the arc structures undulating periodically. Upper and lower surfaces of the cathode 40 disposed on the organic electroluminescent structure 30 also have arc structures undulating periodically. With reference to FIG. 5, because the arc structures undulating periodically are existed, an interface of each function layer of the organic electroluminescent device is changed from a flat surface to an arc surface so that incident angles of some lights become small such that a total reflection inside the device is avoided. Besides, the refraction index of the PEDOT:PSS thin film is lower, about 1.4, which is smaller than a refraction index of a usually glass substrate. When lights enter the substrate from the anode, a total reflection will not be generated. In addition, the refraction index of the PEDOT:PSS thin film is similar to refraction index of a flexible substrate material so that the loss of the total reflection at the same time. Emitting light obtained from the substrate 10 is increased, and a light efficiency is increased.

With reference to FIG. 3, FIG. 3 is an organic electroluminescent device structure according to a first embodiment of the present invention, wherein, the arc structure undulating periodically is a wavy arc shape.

With reference to FIG. 4, FIG. 4 is an organic electroluminescent device structure according to the second embodiment of the present invention. The difference between the present embodiment and the first embodiment is that the arc structure undulating periodically is formed by multiple projected semicircles and multiple depressed semicircles connected alternately.

Preferably, the arc structure undulating periodically is a wavy arc shape.

Specifically, the organic electroluminescent structure 30 includes a hole injection layer (HIL) and hole transportation layer (HTL) 31, an organic light-emitting layer 32 and an electron transportation layer (ETL) and electron injection layer (EIL) (not shown in the figures) formed on the other side of the organic light-emitting layer 32.

Specifically, the cathode 40 is made of a metal material or an alloy material.

Figure 6:
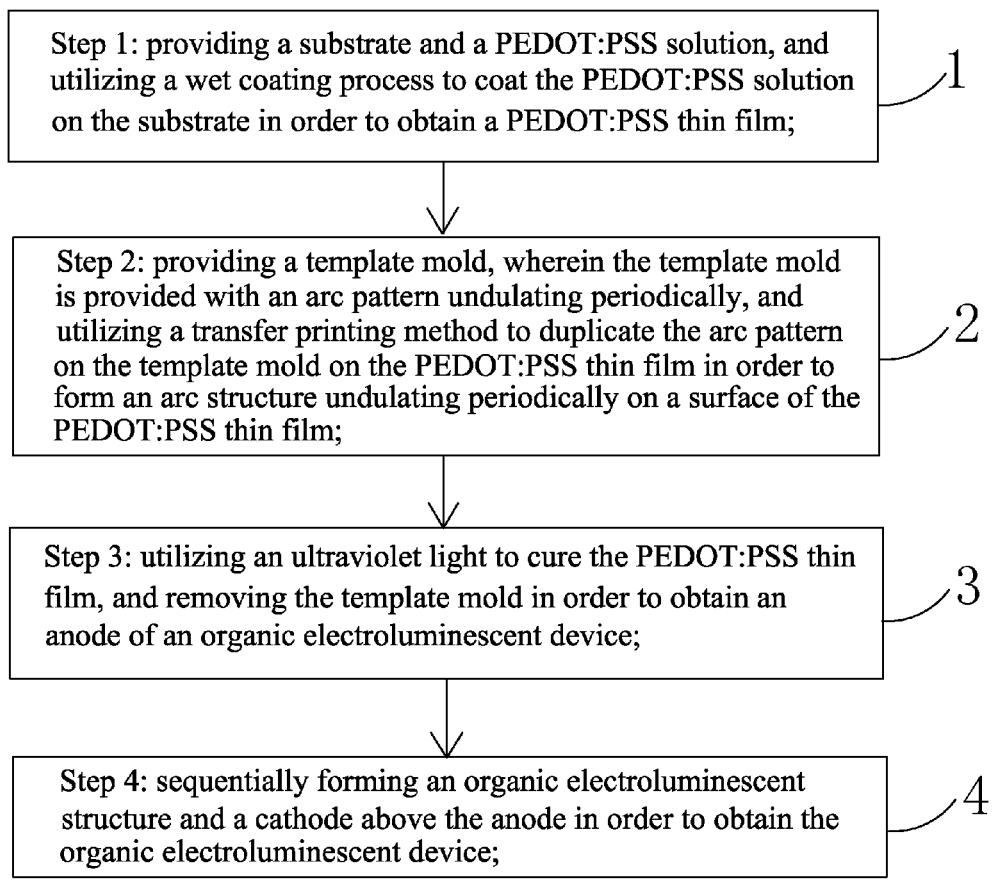
FIG. 6 is a flow chart of a manufacturing method for an organic electroluminescent device according to the present invention.
Figure 7:
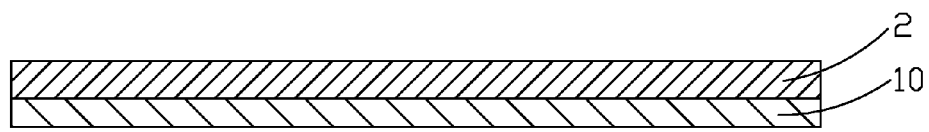
FIG. 7 is a schematic diagram of a step 1 in the manufacturing method for an organic electroluminescent device according to the present invention.
Figure 8:
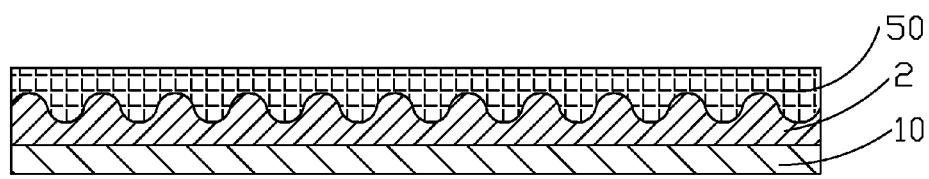
FIG. 8 is a schematic diagram of a step 2 in the manufacturing method for an organic electroluminescent device according to the present invention.

With reference to FIG. 6, the present invention also provides a manufacturing method for an organic electroluminescent device, comprising following steps:

Step 1: as shown in FIG. 7, providing a substrate 10 and a PEDOT:PSS solution, and utilizing a wet coating process to coat the PEDOT:PSS solution on the substrate 10 in order to obtain a PEDOT:PSS thin film 2;

Specifically, the substrate 10 is a glass substrate or a flexible substrate;

Specifically, the wet coating process is a spin coating process;

Step 2: as shown in FIG. 8, providing a template mold 50, wherein the template mold 50 is provided with an arc pattern undulating periodically, and utilizing a transfer-printing method to duplicate the arc pattern on the template mold 50 on the PEDOT:PSS thin film 2 so as to form an arc structure undulating periodically on the surface of the PEDOT:PSS thin film 2.

Figure 9:
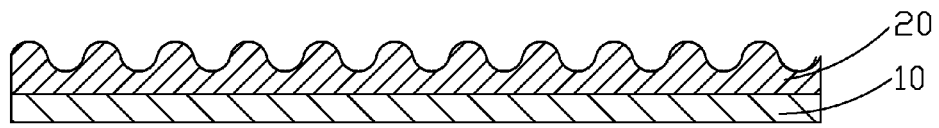
FIG. 9 is a schematic diagram of a step 3 in the manufacturing method for an organic electroluminescent device according to the present invention.

Step 3: as shown in FIG. 9, utilizing an ultraviolet light to cure the PEDOT:PSS thin film 2, removing the template mold 50 in order to obtain an anode 20 of the organic electroluminescent device;

Step 4: utilizing an evaporation method to sequentially form an organic electroluminescent structure 30 and a cathode 40 on the anode 20, and obtaining the organic electroluminescent device shown in FIG. 3 and FIG. 4.

Specifically, when the organic electroluminescent device 30 is evaporated on the anode 20, the organic electroluminescent structure 30 is attached on the surface of the anode 20 having the arc structure undulating periodically. The anode 20 has a function as patterning the organic electroluminescent structure 30 such that an upper surface and a lower surface of the organic electroluminescent structure 30 have corresponding structures which is corresponding to the structures on the surface of the anode. Similarly, an upper surface and a lower surface of the cathode 40 also have corresponding structures.

Specifically, in the step 2, the pattern of the template mold 50 used for forming an arc structure undulating periodically on the surface of the PEDOT:PSS thin film 2 is regular and neat. That is, the arc structure undulating periodically on the surface of the anode 20 is regular and neat.

Specifically, the arc structure undulating periodically is a wavy arc shape, or formed by multiple projected semicircles and multiple depressed semicircles connected alternately. Preferably, the arc structure undulating periodically is a wavy arc shape.

With reference to FIG. 5, because the arc structures undulating periodically are existed, an interface of each function layer of the organic electroluminescent device is changed from a flat surface to an arc surface so that incident angles of some lights become small such that a total reflection inside the device is avoided. Besides, the refraction index of the PEDOT:PSS thin film is lower, about 1.4, which is smaller than a refraction index of a usually glass substrate. When lights enter the substrate from the anode, a total reflection will not be generated. In addition, the refraction index of the PEDOT:PSS thin film is similar to refraction index of a flexible substrate material so that the loss of the total reflection at the same time. Therefore, the emitting light obtained from the substrate 10 of the organic electroluminescent device of the present invention is increased, and a light efficiency is increased.

Specifically, the organic electroluminescent structure 30 formed in the step 4 includes a hole injection layer (HIL) and hole transportation layer (HTL) 31, an organic light-emitting layer 32 and an electron transportation layer (ETL) and electron injection layer (EIL) (not shown in the figures) formed on the other side of the organic light-emitting layer 32.

Specifically, the cathode formed in the step 4 utilizes a metal material or an alloy material.

Specifically, the organic electroluminescent device manufactured in the step 4 is a bottom-emitting type organic electroluminescent device.

In summary, in the organic electroluminescent device structure of the present invention, surfaces of the anode, the organic electroluminescent structure and the cathode all have arc structures undulating periodically so as to avoid the total reflection in propagating an exit light to the substrate, and increase the light efficiency. Besides, the present invention utilizes a PEDOT:PSS thin film as a material for the anode to replace an ITO material so that the cost is reduced. The present invention also provides a manufacturing method for an organic electroluminescent device. Utilizing a wet coating process to form the PEDOT:PSS thin film as the anode so as to reduce the cost. Utilizing a transfer-printing method to pattern the PEDOT:PSS thin film so as to form an arc structure undulating periodically on the PEDOT:PSS thin film (that is, the anode). The manufacturing method is simple and easy to implement. In the organic electroluminescent device manufactured by the present invention, an incident angle of an emitting light emitted by the organic electroluminescent structure is decreased because of changing the interfaces of the organic electroluminescent device so as to avoid the total reflection inside the organic electroluminescent device such that most light can be propagated out from the substrate. Accordingly, a light efficiency of the bottom-emitting type organic electroluminescent device is increased.

As stated above, for one person skilled in the art, other corresponding changes can be obtained according to technology solution and technology idea of the present invention. However, they are still covered by the claims in the present invention.

What is claimed is:

1. A manufacturing method for an organic electroluminescent device, comprising:
   step 1: providing a substrate and a PEDOT:PSS solution, and utilizing a wet coating process to coat the PEDOT:PSS solution on the substrate in order to obtain a PEDOT:PSS thin film;
   step 2: providing a template mold, wherein the template mold is provided with an arc pattern undulating periodically, and utilizing a transfer printing method to duplicate the arc pattern on the template mold on the PEDOT:PSS thin film in order to form an arc structure undulating periodically on a surface of the PEDOT:PSS thin film;
   step 3: utilizing an ultraviolet light to cure the PEDOT:PSS thin film, and removing the template mold in order to obtain an anode of an organic electroluminescent device; and
   step 4: sequentially forming an organic electroluminescent structure and a cathode above the anode in order to obtain the organic electroluminescent device;
   wherein the substrate has an optical transparency, and a refractive index of the PEDOT:PSS thin film is less than or equal to a refractive index of the substrate;
   wherein a surface of each of the organic electroluminescent structure and the cathode has an arc structure undulating periodically;
   wherein the organic electroluminescent structure includes a hole injection layer, a hole transport layer and an organic light-emitting layer, and the hole injection layer and the hole transport layer are disposed between the anode and the organic light-emitting layer; and
   wherein an interface between the anode and the hole injection layer and the hole transportation layer also has an arc structure undulating periodically.

2. The manufacturing method for an organic electroluminescent device according to claim 1, wherein the substrate provided in the step 1 is a glass substrate and the refractive index of the PEDOT:PSS thin film is less than the glass substrate.

3. The manufacturing method for an organic electroluminescent device according to claim 1, wherein the wet coating process in the step 1 is a spin coating process.

4. The manufacturing method for an organic electroluminescent device according to claim 1, wherein the cathode formed in the step 4 utilizes a metal material or an alloy material.

5. A manufacturing method for an organic electroluminescent device, comprising:
   step 1: providing a substrate and a PEDOT:PSS solution, and utilizing a wet coating process to coat the PEDOT:PSS solution on the substrate in order to obtain a PEDOT:PSS thin film;
   step 2: providing a template mold, wherein the template mold is provided with an arc pattern undulating periodically, and utilizing a transfer printing method to duplicate the arc pattern on the template mold on the PEDOT:PSS thin film in order to form an arc structure undulating periodically on a surface of the PEDOT:PSS thin film;
   step 3: utilizing an ultraviolet light to cure the PEDOT:PSS thin film, and removing the template mold in order to obtain an anode of an organic electroluminescent device; and
   step 4: sequentially forming an organic electroluminescent structure and a cathode above the anode in order to obtain the organic electroluminescent device;
   wherein the substrate provided in the step 1 is a glass substrate and a flexible substrate;
   wherein the wet coating process in the step 1 is a spin coating process;
   wherein the organic electroluminescent device structure formed in the step 4 includes a hole injection layer, a hole transport layer and an organic light-emitting layer; and
   wherein the cathode formed in the step 4 utilizes a metal material or an alloy material;
   wherein the substrate has an optical transparency, and a refractive index of the PEDOT:PSS thin film is less than or equal to a refractive index of the substrate;
   wherein a surface of each of the organic electroluminescent structure and the cathode has an arc structure undulating periodically;
   wherein the hole injection layer and the hole transport layer are disposed between the anode and the organic light-emitting layer; and
   wherein an interface between the anode and the hole injection layer and the hole transportation layer also has an arc structure undulating periodically.

* * * * *